(12) United States Patent
Bertolini et al.

(10) Patent No.: US 12,267,047 B2
(45) Date of Patent: Apr. 1, 2025

(54) AMPLIFIER CIRCUIT, CORRESPONDING DEVICE AND METHOD

(71) Applicant: STMicroelectronics S.r.l., Agrate Brianza (IT)

(72) Inventors: Alessandro Bertolini, Vermiglio (IT); Germano Nicollini, Piacenza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 387 days.

(21) Appl. No.: 17/720,502

(22) Filed: Apr. 14, 2022

(65) Prior Publication Data
US 2022/0337198 A1    Oct. 20, 2022

(30) Foreign Application Priority Data
Apr. 16, 2021    (IT) .......................... 102021000009653

(51) Int. Cl.
*H03F 1/30*    (2006.01)
*H03F 3/04*    (2006.01)

(52) U.S. Cl.
CPC ............... *H03F 1/301* (2013.01); *H03F 3/04* (2013.01)

(58) Field of Classification Search
CPC . H03F 1/301; H03F 3/04; H03F 3/345; H03F 3/45076; H03F 1/30; H03F 3/45273
USPC .................................................. 330/252–261
See application file for complete search history.

(56) References Cited

U.S. PATENT DOCUMENTS

| | | | |
|---|---|---|---|
| 5,343,164 A * | 8/1994 | Holmdahl ........... | H03F 3/45076 330/261 |
| 5,889,393 A | 3/1999 | Wrathall | |
| 7,986,188 B2 * | 7/2011 | Fujiwara ................. | G05F 1/575 330/257 |
| 8,841,897 B2 * | 9/2014 | Williams .............. | G05F 1/5735 323/285 |
| 9,766,643 B1 | 9/2017 | Cai et al. | |
| 2008/0169795 A1 | 7/2008 | Wang | |

OTHER PUBLICATIONS

Li Kan et al: "A 600-mA, Fast-Transient Low-Dropout Regulator With Pseudo-ESR Technique in 0.18-$/mu$ m CMOS Process", IEEE Transactions on Very Large Scale Integration (VLSI) Systems, IEEE Service Center, Piscataway, NJ, USA, vol. 28, No. 2. IT Search Report and Written Opinion for priority application, IT Appl. No. 102021000009653, report dated Dec. 9, 2021, 12 pgs.

* cited by examiner

*Primary Examiner* — Hieu P Nguyen
(74) *Attorney, Agent, or Firm* — Crowe & Dunlevy LLC

(57) ABSTRACT

An amplifier circuit includes a first input stage with a differential input transistor pair and a second gain stage having an output node coupled to a load. A node in the first gain stage is coupled to the output node in the second gain stage. A feedback line couples the output node to the control node of a first transistor of the differential input transistor pair. Current mirror circuitry is coupled to a current flow path through a further transistor in the second gain stage and includes a sensing node configured to produce a sensing signal indicative of the current supplied to the load. The sensing signal at the sensing node is directly fed back to the control node of the first transistor of the differential input transistor pair to provide a zero in the loop transfer function that is matched to and tracks and cancels out a load-dependent pole.

20 Claims, 7 Drawing Sheets

_US 12,267,047 B2_

AMPLIFIER CIRCUIT, CORRESPONDING DEVICE AND METHOD

PRIORITY CLAIM

This application claims the priority benefit of Italian Application for Patent No. 102021000009653, filed on Apr. 16, 2021, the content of which is hereby incorporated by reference in its entirety to the maximum extent allowable by law.

TECHNICAL FIELD

The description relates to amplifier circuits.

One or more embodiments can be applied advantageously to amplifiers with precise signal amplification specifications.

BACKGROUND

Despite the continued activity in the area, amplifiers exhibiting improved performance in terms of precise signal amplification (e.g., accuracy better than 0.1%), large output swing (e.g., close to the supply voltage) and stable behavior for a wide range of capacitive loads (virtually any capacitive load) are still in demand.

There is a need in the art for providing improved amplifiers in line with such a demand.

SUMMARY

One or more embodiments may relate to an amplifier circuit.

One or more embodiments may relate to a corresponding device.

A device including electrostatic and/or piezo-electric actuators, e.g., with an associated capacitive value from few pF to tens of nF, may be exemplary of such a device.

One or more embodiments may relate to a corresponding design method.

One or more embodiments may provide one or more of the following advantages: simplicity, insofar as only one transistor and one current generator (or only two transistors, in the case of a class AB amplifier) are added; negligible extra area and power dissipation; accurate closed-loop gain; large output voltage swing (close to VCC); stability for a wide range of capacitive loads; and easy extendibility to fully-differential amplifiers.

In an embodiment, a circuit comprises: a first gain stage having a differential input transistor pair comprising a first transistor and a second transistor having respective control nodes and respective current flow paths therethrough and a bias current source coupled to the respective current flow paths through the first transistor and the second transistor, wherein the control nodes of the first transistor and the second transistor are configured to have an input signal applied therebetween, and the second transistor is located between the bias current source and a coupling node in the current flow path through the second transistor; and a second gain stage having an output node configured to be coupled to a load and to apply thereto an output voltage which is a function of the input signal applied between the control nodes of the first transistor and the second transistor wherein the second gain stage comprises a further current flow path through at least one further transistor.

The circuit further comprises: a coupling network of the second gain stage to the first second gain stage, the coupling network coupling the coupling node in the first gain stage to the output node in the second gain stage; and a feedback line coupling the output node in the second gain stage to the control node of the first transistor in the first gain stage.

The circuit still further comprises: current mirror circuitry coupled to said further current flow path through at least one further transistor in the second gain stage, the current mirror circuitry comprising a current mirror flow line between a supply line and ground with a sensing node in the current mirror flow line configured to produce a sensing signal which is indicative of the current supplied to the load at the output node; and a coupling line coupling the sensing node in the current mirror flow line in the second gain stage to the control node of the first transistor in the first gain stage, wherein the sensing signal at the sensing node is fed back to the control node of the first transistor in the first gain stage.

In an embodiment, a circuit comprises: a differential input stage including a pair input transistors have control terminals configured to receive a first signal and a second signal, wherein a first input transistor of said pair input transistors generates a difference signal; an output stage including an output transistor having a control terminal configured to receive the difference signal and a drain terminal that generates an output signal; a resistive feedback circuit coupled between the drain terminal of the output transistor and the control terminal of a second input transistor of said pair input transistors; a sense transistor connected to said output transistor in a current mirror circuit, said sense transistor having a control terminal configured to receive the difference signal and a drain terminal that generates a sensing signal indicative of current delivered by the output signal; and a feedback path configured to apply the sensing signal to said second input transistor of said pair input transistors.

BRIEF DESCRIPTION OF THE DRAWINGS

One or more embodiments will now be described, by way of example only, with reference to the annexed figures, wherein.

DETAILED DESCRIPTION

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description: a same designation may be used to designate both a line or node and a signal which may occur at that node (e.g., $V_{IN}$, $V_{OUT}$); a same designation may be used to designate both a certain component (a resistor or a capacitor, for instance) and an associated electrical parameter (resistance or capacitance, for instance); and like parts or elements are indicated in the various figures with like reference signs, and a corresponding description will not be repeated for each and every figure.

Figure 1:
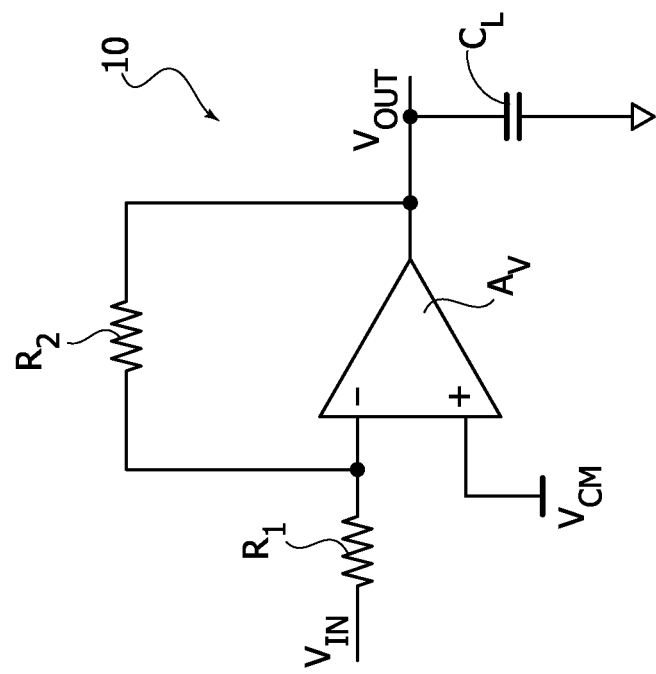
FIG. 1 is a diagram of an amplifier circuit.

FIG. 1 is a basic circuit diagram of an amplifier circuit 10 which may be considered for applications that require (very) precise signal amplification (e.g., better than 0.1% accuracy), large output swing (e.g., close to the supply voltage) and stable behavior under any capacitive load.

The circuit of FIG. 1 is built around a differential gain stage $A_V$ assumed to have a (very) high gain ($A_V \gg 1$).

As illustrated in FIG. 1, the gain stage $A_V$ has a non-inverting input (+) coupled to a node at a reference (e.g., common-mode) voltage $V_{CM}$ and is configured to receive a (voltage) input signal $V_{IN}$ applied to the inverting input (−) via a first resistor $R_1$.

In response to the (voltage) input signal $V_{IN}$ being applied to the first resistor $R_1$, the amplifier circuit 10 configured to produce at its output a (voltage) output signal $V_{OUT}$ to be applied to a capacitive load $C_L$.

As illustrated in FIG. 1, the gain stage $A_V$ has a second resistor $R_2$ coupled between the output node and the inverting input (−) to provide a (negative) feedback line setting the ratio $V_{OUT}/V_{IN}$ (provided the gain stage $A_V$ has a very high gain).

The general representation of FIG. 1 also applies to "non-inverting" configurations where the voltage $V_{CM}$ is exchanged for $V_{IN}$: corresponding configurations will be discussed in the following in connection with FIGS. 6 and 8.

Particularly when the capacitive load has a very large value, an arrangement as illustrated in FIG. 1 is not exposed to stringent specifications in terms of closed-loop bandwidth.

This facilitates achieving a reasonable tradeoff between (large) load capacitances and amplifier bandwidth.

In principle, a single amplifier stage would be capable of driving virtually any capacitive load without causing stability problems.

However, a single stage (even of the telescopic or folded cascode type) may not have enough DC open-loop gain when loaded with a resistive feedback. Also, a single stage may be unable to have an output swing close to the supply voltage.

Two-stage amplifier circuits can be employed in order to address these issues.

Figure 2:
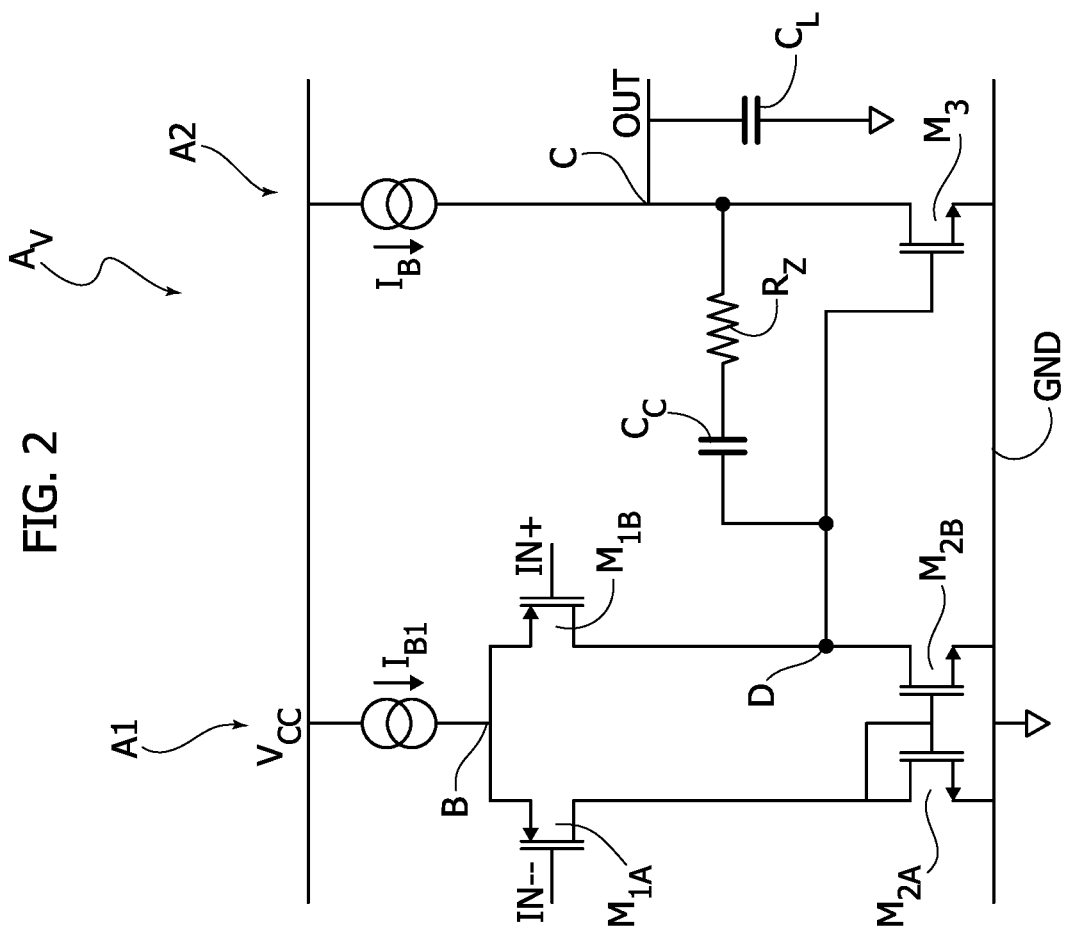
FIG. 2 illustrates details of a possible two-stage implementation of an amplifier circuit as illustrated in FIG. 1.

A well-known two-stage operational transconductance amplifier (OTA) is the so-called Miller amplifier as illustrated in FIG. 2.

As illustrated in FIG. 2, such an amplifier comprises a first differential stage A1 with a current generator $I_{B1}$ coupled to a supply line at a voltage $V_{CC}$ and configured to supply at a node B a bias current towards the parallel connection of a first current flow line and a second current flow line between the node B and ground GND.

The first current flow line includes the cascaded current flow paths (source-drain, in the exemplary case of MOSFET transistors considered herein) through a first pair of transistors, namely a transistor $M_{1A}$ and a (diode connected) transistor $M_{2A}$.

The second current flow line includes the cascaded current flow paths (source-drain, in the exemplary case of MOSFET transistors considered herein) through a second pair of transistors, namely a transistor $M_{1B}$ and a transistor $M_{2B}$.

A differential input voltage (IN+ and IN−) is applied across the control terminals (gates, in the exemplary case of MOSFET transistors considered herein) of the transistor $M_{1B}$ (which is arranged between the node B and the transistor $M_{2B}$) and of the transistor $M_{1A}$ (which is arranged between the node B and the transistor $M_{2A}$).

The transistors $M_{2A}$ and $M_{2B}$ have their control terminals (gates, in the exemplary case of MOSFET transistors considered herein) mutually coupled in a current mirror configuration.

As illustrated in FIG. 2, a second stage A2 comprises a current generator $I_B$ again coupled to the supply line at a voltage $V_{CC}$. Such a current generator supplies at a node C (which also provides an output node OUT shown having a capacitive load $C_L$ coupled thereto) a bias current to the current flow path (source-drain, in the exemplary case of a MOSFET transistor considered herein) through a transistor $M_3$, arranged intermediate the node C/OUT and ground GND.

As illustrated in FIG. 2, the control terminal (gate, in the exemplary case of a MOSFET transistor considered herein) of the transistor $M_3$ is coupled to the second current flow line in the first stage A1 at a node D intermediate the transistors $M_{1B}$ and $M_{2B}$.

The first stage A1 and the second stage A2 are also coupled via the series connection of a capacitor $C_C$ and a resistor $R_Z$ intermediate the node C/OUT and the node D.

It can be shown that the transfer function of a circuit as exemplified in FIG. 2 has poles $p_d$, $p_1$ and $p_2$ and a zero $Z_1$ given by the following formulas:

$$p_d = -\frac{1}{r_{o1}(1 + g_{m3}r_{out})C_C}$$

$$p_1 \cong -\frac{g_{m3}}{C_L}$$

$$p_2 \cong -\frac{1}{R_Z C_{GS3}}$$

$$z_1 = \frac{1}{\left(\frac{1}{g_{m3}} - R_Z\right)C_C}$$

Where: $C_C$, $C_L$ and $R_Z$ are the capacitance and resistance values of the identically-named components illustrated in FIG. 2; rout is the total resistance at the output node, i.e. the output resistance of the transistor $M_3$ in parallel with the (external) resistive feedback; $r_{O1}$ is the output resistance of the first stage $A_1$, that is, the output resistance of the transistor $M_{2B}$ in parallel with the output resistance of the transistor $M_{1B}$; $g_{m3}$ is the transconductance of the transistor $M_3$; and $C_{GS3}$ is the (parasitic) gate-source capacitance of the MOSFET transistor $M_3$.

Since $p_2$ is at a high frequency for conventional resistance values for $R_Z$, usually $R_Z$ is chosen to move the right-hand plane (RHP) zero $Z_1$ to infinite.

However, in those cases where $C_L$ is known, a designer may elect to move the zero from the right-hand plane (RHP) to the left-hand plane (LHP) by choosing:

$$R_Z = \frac{1 + \frac{C_L}{C_C}}{g_{m3}}$$

in order to cancel the first non-dominant pole $p_1$ with a left-hand plane (LHP) zero.

Figure 3:
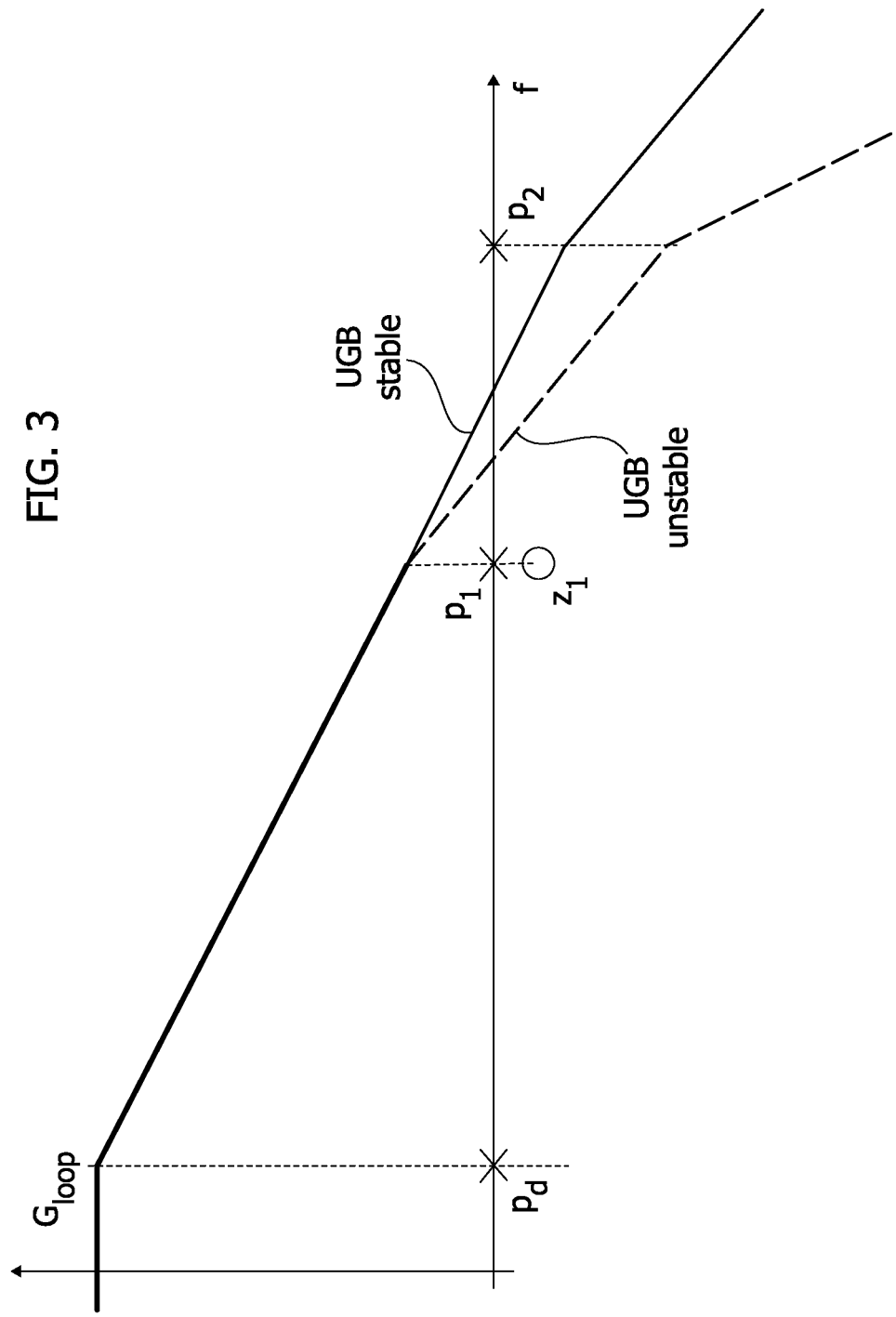
FIGS. 3 and 4A, 4B are gain v. frequency plots for an amplifier circuit showing possible stable/unstable behaviors.

The result is shown in FIG. 3, where the loop gain $G_{loop}$ (ordinate scale, arbitrary values) of an amplifier circuit including the two-stage Miller amplifier of FIG. 2 is plotted against frequency f (abscissa scale).

The corresponding Unity-Gain Bandwidth (UGB) is:

$$UGB \cong \frac{g_{m1}}{C_C}$$

where $g_{m1}$ denotes the transconductances of the transistors $M_{1A}$ and $M_{1B}$.

Around the UGB the slope of the $G_{loop}$ plot is, e.g., 20 dB/decade and the amplifier is stable according to well-known control theory.

However, it is noted that this approach suffers from two intrinsic drawbacks.

In the first place, if $C_L$ is very high, either $R_Z$ or $C_C$ become likewise high and the corresponding components (resistor/capacitor) become unduly huge and practically incompatible with integration in an integrated circuit chip.

As a first example: if $C_L$=1 µF→assuming $g_{m3}$=100 µA/V and $C_C$=10 pF, then $R_Z$=1 GOhm.

As a second example: if $C_L$=1 µF→assuming $g_{m3}$=100 µA/V and $R_Z$=10 kOhm, then $C_C$=1 µF Additionally, the spread of $g_m$, $C_C$, $R_Z$, and $C_L$ in mass production generates a large and random mismatch between the pole to be cancelled and the cancelling zero.

Figure 4A:
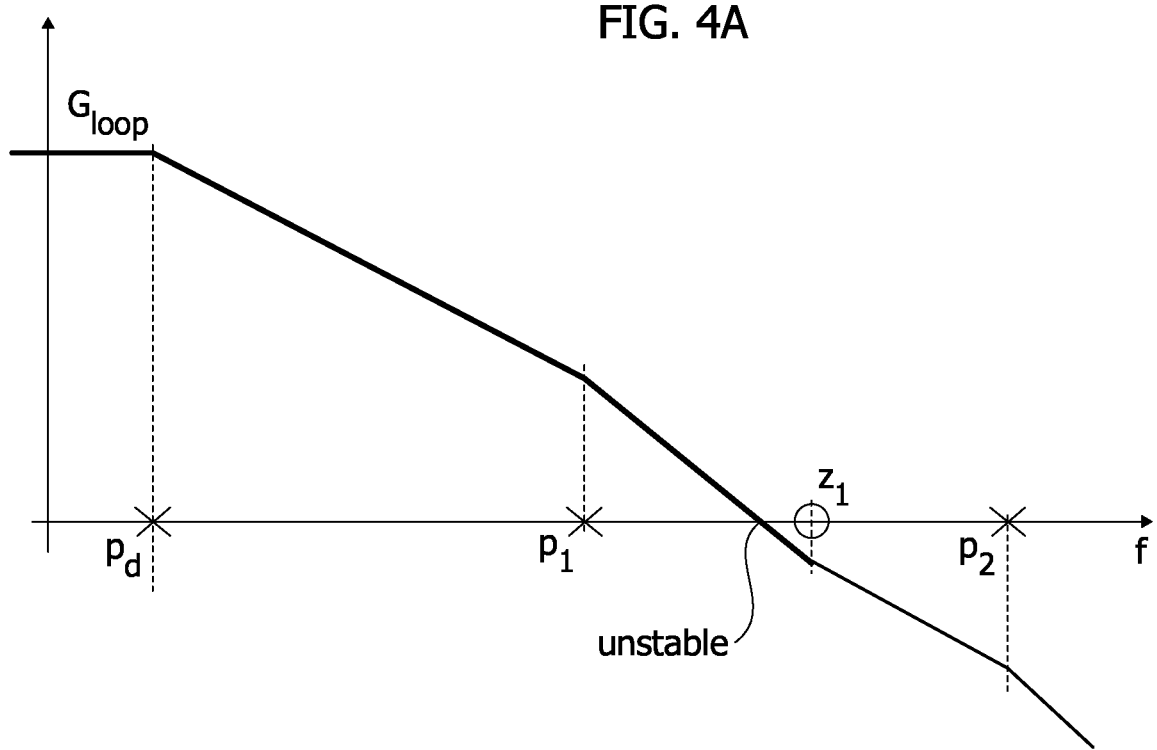
Figure 4B:
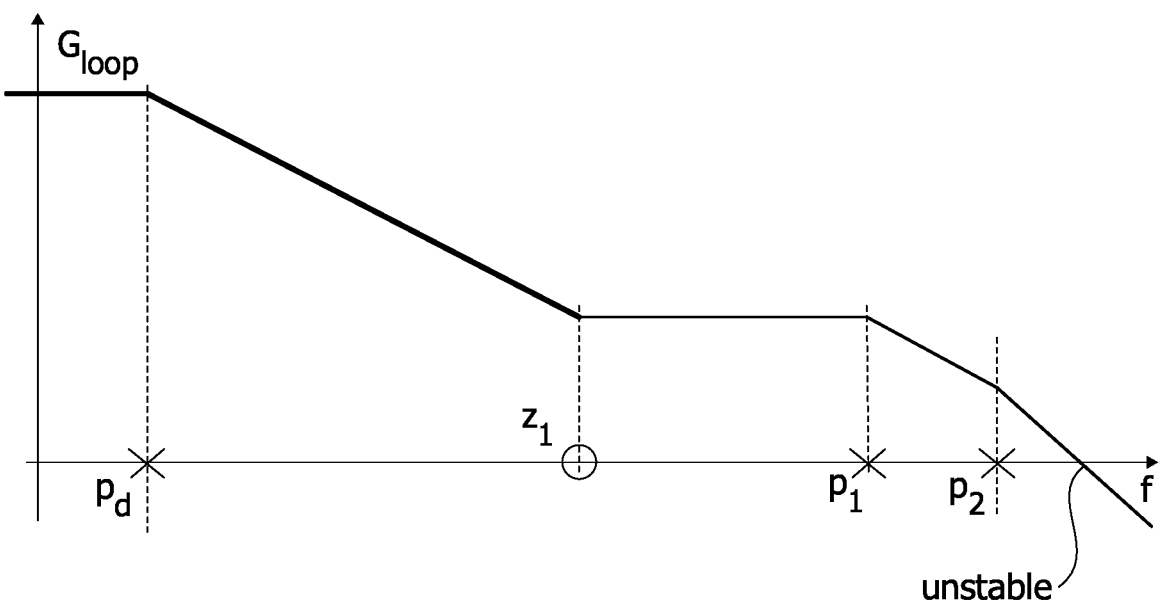

That is, an uncontrolled pole/zero doublet may be created which leads the amplifier in an unstable state, as shown in FIGS. 4A and 4B.

In FIGS. 4A and 4B loop gain $G_{loop}$ (ordinate scale, arbitrary values) is plotted against frequency f (abscissa scale).

Specifically, FIG. 4A shows that a spread may move the pole at a lower frequency than the zero, whereas FIG. 4B describes the opposite case where the zero moves to a lower frequency than the pole.

In both instances, around the UGB the slope of the $G_{loop}$ may be, e.g., 40 dB/decade, and the amplifier is unstable, according to well-known control theory.

Consequently, a solution as discussed in connection with FIG. 2 is not satisfactory for use in contexts where values likely to render the circuit unstable may be expected for the load capacitance $C_L$.

In that respect, it is noted that—while illustrated and discussed herein for the sake of explanation and understanding—the load per se may represent a distinct element from the amplifier circuit.

For instance, the amplifier circuit and the load may be sourced by different suppliers to a manufacturer of a device where the load is finally coupled to the amplifier circuit.

One or more embodiments involve creating a zero in the transfer function for Gloop with the aim of tracking—in a notionally perfect manner—the output pole, independently of process, temperature, and supply voltage factors.

In one or more embodiments this can be achieved by sensing ("reading") the "capacitive" output current supplied to the load $C_L$ and feeding it back to a node in the loop in order to create a zero in Gloop that depends on the capacitance $C_L$ of the load.

It is again noted that—while illustrated and discussed herein for the sake of explanation and understanding—the load per se may represent a distinct element from the amplifier circuit.

Figure 5:
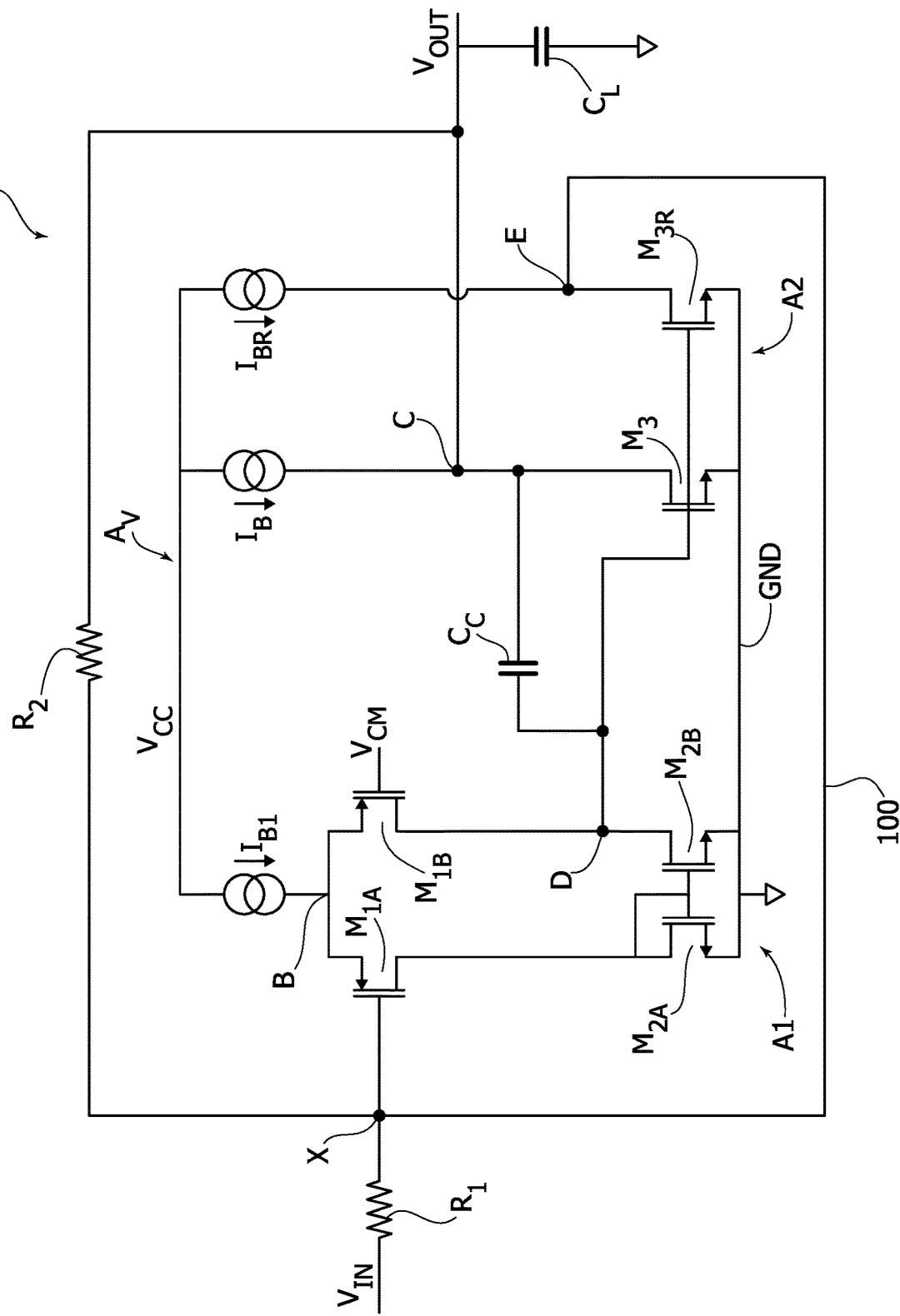
FIG. 5 is a circuit diagram illustrative of a possible implementation of a class-A amplifier circuit according to embodiments of the present description in an inverting configuration.

A first possible implementation is illustrated in FIG. 5.

In FIG. 5 (and in FIGS. 6, 7 and 8 as well) parts, elements or entities like parts, elements or entities already discussed in connections with the previous figures are indicated with like reference signs/designations: a corresponding description will not be repeated for brevity for each of these figures.

Also, in order to avoid making the instant description unduly burdensome, the general description of the two-stage amplifier provided in connection with FIG. 2 will not be repeated. Consequently, unless the context and the related additional disclosure indicates otherwise, the general description of the two-stage amplifier provided in connection with FIG. 2 applies mutatis mutandis to FIGS. 5 to 8.

In fact, the circuit diagrams of FIGS. 5 to 8 can be regarded as exemplary of a circuit which (like the circuit of FIG. 2) comprises a first gain stage A1 including: a differential input transistor pair comprising a first transistor $M_{1A}$ and a second transistor $M_{1B}$ having respective control nodes and current flow paths therethrough; a bias current source $I_{B1}$ coupled (at a node B) to the current flow paths through the first transistor $M_{1A}$ and the second transistor $M_{1B}$, and the control nodes of the first transistor $M_{1A}$ and the second transistor $M_{1B}$ configured to have an input signal applied therebetween.

As discussed in the following, all of the circuit diagrams illustrated FIGS. 5 to 8 include a (first) feedback line comprising a pair of resistors $R_1$, $R_2$ in a voltage-divider configuration.

One of these resistors (namely $R_2$) couples the output node $V_{OUT}$ (also referred to as node C in the following) of the amplifier with the control node (gate, in the exemplary case of a MOSFET transistor considered herein) of the first transistor $M_{1A}$.

Figure 6:
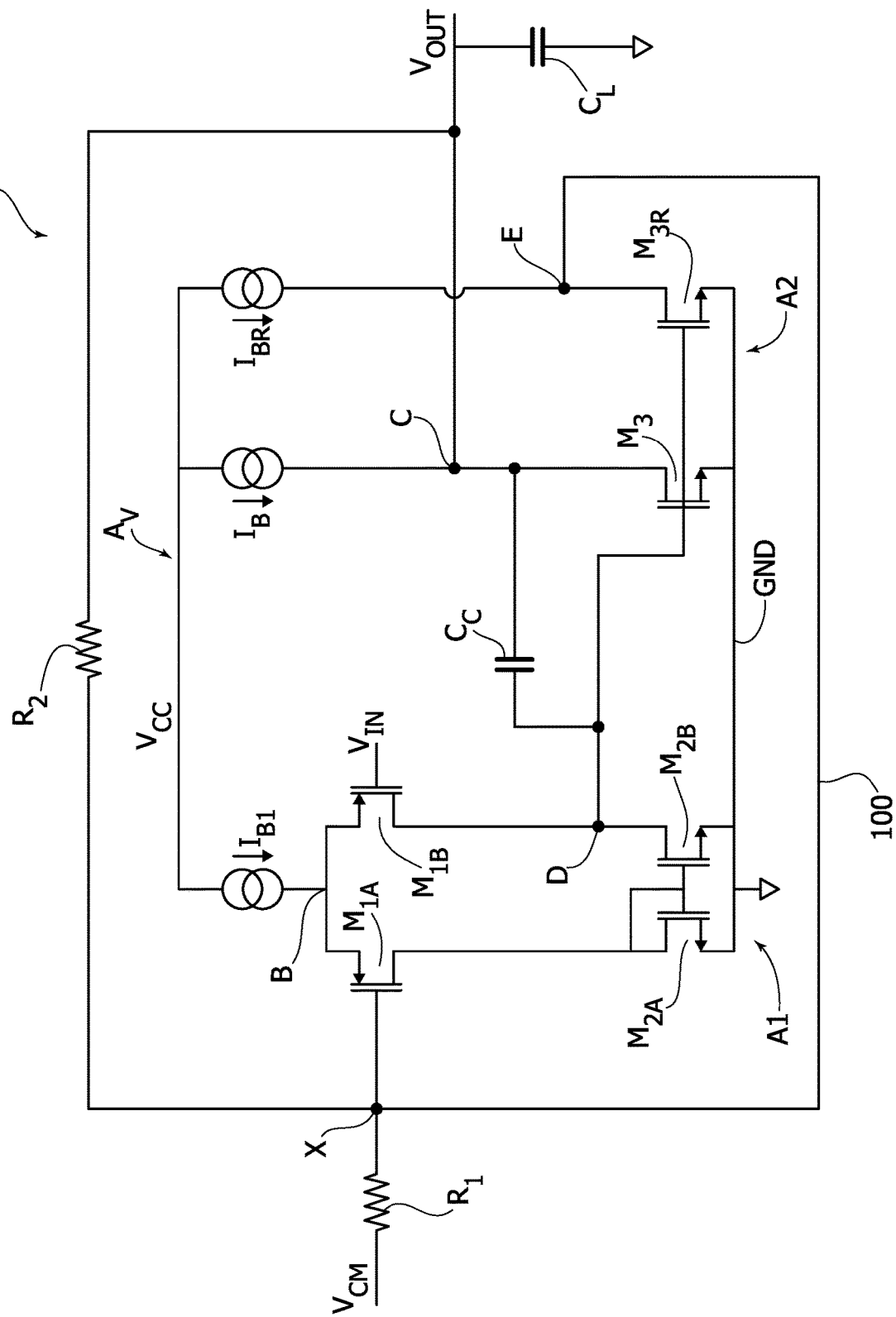
FIG. 6 is a circuit diagram illustrative of a possible implementation of a class-A amplifier circuit according to embodiments of the present description in an non-inverting configuration.
Figure 7:
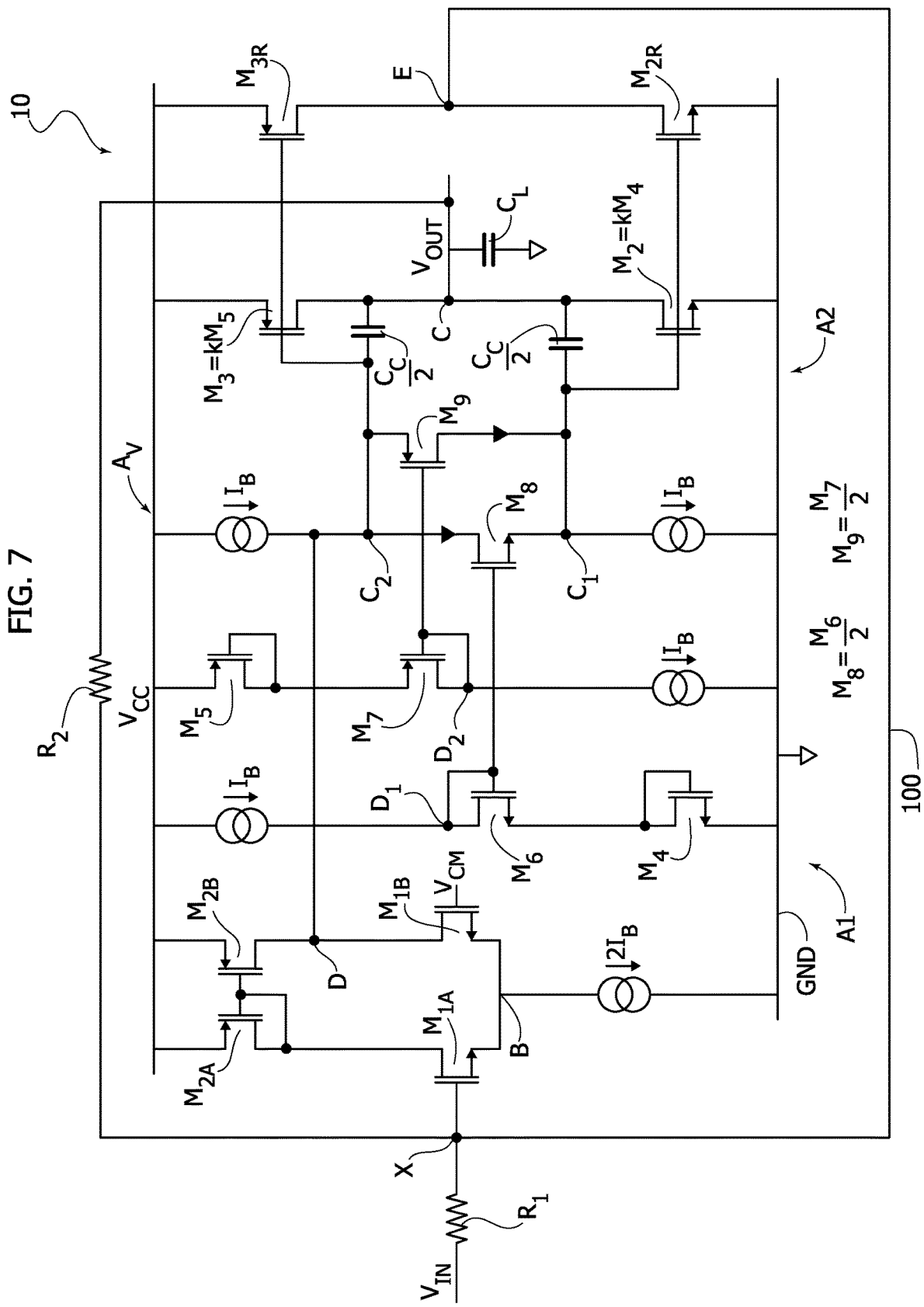
FIG. 7 is a circuit diagram illustrative of a possible implementation of a class-AB amplifier circuit according to embodiments of the present description in an inverting configuration.
Figure 8:
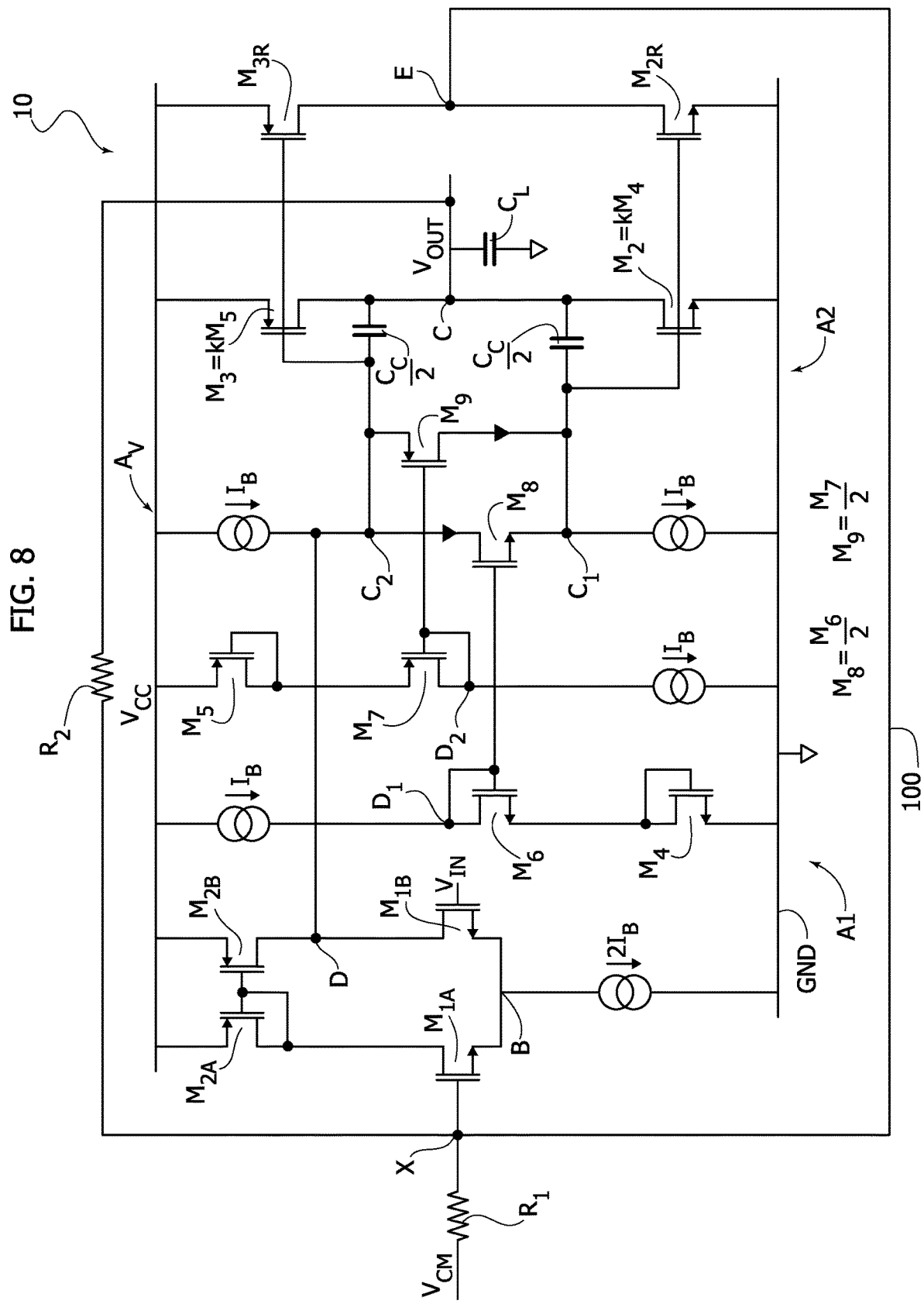
FIG. 8 is a circuit diagram illustrative of a possible implementation of a class-AB amplifier circuit according to embodiments of the present description in a non-inverting configuration.

The other resistor in the pair (namely $R_1$) is coupled to the control node of the first transistor $M_{1A}$ and is configured to apply to the control node of the first transistor $M_{1A}$: in inverting configurations as illustrated in FIG. 5 and FIG. 7—an input signal $V_{IN}$ with the control node of the second transistor $M_{1B}$ having applied thereto a reference signal $V_{CM}$; or in non-inverting configurations as illustrated in FIG. 6 and FIG. 8—a reference signal $V_{CM}$ with the control node of the second transistor $M_{1B}$ having applied thereto an input signal $V_{IN}$.

Whatever the arrangement adopted, the control nodes of the first transistor $M_{1A}$ and the second transistor $M_{1B}$ are thus configured to have an input signal applied therebetween, which—as illustrated in FIGS. 5 to 8—may be via the resistor $R_1$.

As illustrated, the second transistor $M_{1B}$ is located between the bias current source $I_{B1}$ (node B) and a coupling node D in the current flow path through the second transistor $M_{1B}$.

Likewise, the circuit diagrams of FIGS. 5 to 8 include a second gain stage A2 having an output node C (or $V_{OUT}$) configured to be coupled to a load $C_L$ and to apply to that load an output voltage $V_{OUT}$ which is a function of the input signal applied between the control nodes of the first transistor $M_{1A}$ and the second transistor $M_{1B}$.

In the exemplary implementation of FIG. 5, the second stage A2 comprises a current mirror circuit which includes a transistor $M_{3R}$ whose control terminal (gate, in the exemplary case of a MOSFET transistor considered herein) is coupled the gate of the transistor $M_3$ plus an associated bias current generator $I_{BR}$.

Such current mirror circuit thus provides a current flow line from the supply line $V_{CC}$ to ground GND which mirrors the output current flow line comprising the transistor $M_3$ and the associated bias current generator $I_B$.

In that way the transistor $M_{3R}$ is capable of "reading" the current which flows into $C_L$ (under the control of the transistor $M_3$ mirrored via the transistor $M_{3R}$) and send a corresponding signal back to the common node X between the resistors $R_1$ and $R_2$ in the resistive feedback network, with the node X representing a virtual ground node.

The implementation of FIG. 5 is thus exemplary of a circuit including a coupling network of the second gain stage A2 to the first gain stage A1.

As illustrated, the coupling network comprises the capacitor $C_C$ which couples the coupling node D in the first gain stage A1 to the output node C or $V_{OUT}$ in the second gain stage A2. In contrast with FIG. 2, in the exemplary implementation of FIG. 5 the nulling resistor $R_Z$ in the coupling network between the stages A1 and A2 can be dispensed with in so far as one or more embodiments as discussed herein contemplate introducing a left-hand plane (LHP) zero.

As discussed previously, a feedback line comprising the resistors $R_1$, $R_2$ is provided coupling—via the resistor $R_2$—the output node C (or $V_{OUT}$) in the second gain stage A2 to the control node of the first transistor $M_{1A}$ in the first gain stage A1.

In the exemplary implementation of FIG. 5, the circuit 10 comprises current mirror circuitry $I_{BR}$, $M_{3R}$ which is coupled to the current flow path through the transistor $M_3$ in the second gain stage A2. As illustrated, the current mirror circuitry $I_{BR}$, $M_{3R}$ comprises a current mirror flow line between the supply line $V_C$) and ground GND with a sensing node E in such a current mirror flow line which is configured to produce a sensing signal which is indicative of the current supplied to the load $C_L$ at the output node $V_{OUT}$.

In the exemplary implementation of FIG. 5, a coupling line 100 is provided coupling the sensing node E in the current mirror flow line to the control node of the first transistor $M_{1A}$ in the first gain stage A1. Consequently, the sensing signal at the sensing node E is fed back to the control node of the first transistor $M_{1A}$ in the first gain stage A1.

It can be shown that, in the exemplary implementation of FIG. 5, the poles and the zero in the transfer function for Gloop are given by the following formulas:

$$p_d = -\frac{1}{r_{o1}(1+g_{m3}r_{out})C_C}$$

$$p_1 = -\frac{g_{m3}(R_1+R_2)+g_{m3R}R_1}{C_L(R_1+R_2)} \cong -\frac{g_{m3}}{C_L}$$

$$z_1 = -\frac{(g_{m3}+g_{m3R})/g_{m3R}}{R_2C_L+C_C(R_2-1/g_{m3R})}$$

where the various entities indicated have the same meaning introduced previously.

The approximation $g_{m3R} \ll g_{m3}$ can be reasonably held to apply provide the output stage is biased with a (much) higher current than the mirror current flow line through the transistor $M_{3R}$.

Advantageously, sizing the transistor $M_{3R}$ and the bias generator $I_{BR}$ in such a way that $g_{m3R}R_2=1$ results in the following relationships:

$$p_1 \cong -\frac{g_{m3}}{C_L}$$

$$z_1 = -\frac{g_{m3}+g_{m3R}}{g_{m3R}R_2C_L} = -\frac{g_{m3}+g_{m3R}}{C_L} \cong -\frac{g_{m3}}{C_L}$$

This corresponds to a nearly perfect mutual cancellation of the output pole and the zero.

This pole-zero cancellation is facilitated by the condition $g_{m3R}R_2=1$ being met in all process, voltage, and temperature (PVT) conditions.

This can be achieved by configuring the transistors $M_3$ and $M_{3R}$ (in a manner known per se) to operate in weak inversion (gate-to-source voltage below the threshold voltage) and choosing biasing currents $I_B$ and $I_{BR}$ of the PTAT (Proportional To Absolute Temperature) type that depend inversely on a resistor $R_{bias}=\alpha R_2$ of the same type of $R_2$ (briefly, with the bias current sources $I_B$ and $I_{BR}$ configured to provide currents inversely proportional to the resistance of the feedback resistor $R_2$).

In that way:

$$g_{m3R} = \frac{I_{BR}}{\eta V_T} = \frac{\Delta_{BE}}{\eta R_{bias}V_T} = \frac{V_T \ln N}{\eta \alpha R_2 V_T} = \frac{\ln N}{\eta \alpha R_2} \rightarrow g_{m3R}R_2 = \frac{\ln N}{\eta \alpha}$$

where $V_T$ is the thermal voltage, $r_1$ is a parameter of the transistor in weak inversion, and N is an integer.

It follows that, by choosing N and a adequately, it is (always) possible to satisfy the relationship $g_{m3R}R_2=1$, independently of PVT conditions.

Thanks to this pole-zero cancellation, an amplifier circuit as exemplified in FIG. 5 is found to exhibit—in terms of stability—a behavior thoroughly similar to the behavior of a single-pole OTA, with the capability of being intrinsically stable irrespective of the value of the capacitive load $C_L$ and even in the presence of a (very) small compensation capacitor $C_C$ (1 pF, for instance).

This may apply, for instance, for closed-loop gains ranging from 0 dB to +20 dB, with $C_L$ varied from 0.1 pF to 10 nF with $C_C=1$ pF. In all the cases considered, the phase margin was found to be always (much) higher than 60 degrees, showing fully adequate stability.

Regarding the closed-loop behavior, since the zero is introduced on the feedback path (and not in the forward path), the closed loop bandwidth is equal to the lower one between the original Unity-Gain Bandwidth (UGB) for Gloop and the zero frequency $z_1$, whereas the in-band gain Gain can be expressed as:

$$\text{Gain} = -\frac{R_2}{R_1\left(1+\frac{g_{m3R}}{g_{m3}}\right)} \cong -\frac{R_2}{R_1}$$

Fully adequate performance was experimented with input and output voltages with 100 kHz, 10 kHz, 1 kHz and a 100 Hz sine-wave inputs, for $C_L$ equal to 10 pF, 100 pF, 1 nF, and 10 nF, respectively, and a 0 dB and 20 dB gain.

The previous discussion applies step-by-step to the non-inverting configuration of the amplifier circuit 10 illustrated in FIG. 6, where the voltage $V_{CM}$ (see FIG. 1) is exchanged for $V_{IN}$.

In the case of FIG. 6, the poles and zero in the transfer function for $G_{loop}$ and the closed-loop poles as well are the same as in the inverting configuration of FIG. 5.

Only the in-band gain Gain is different, since it is non-inverting, and equal to:

$$\text{Gain} = 1 + \frac{R_2}{R_1\left(1+\frac{g_{m3R}}{g_{m3}}\right)} \cong 1 + \frac{R_2}{R_1}$$

The circuit possesses the following features: current mirror circuitry $I_{BR}$, $M_{3R}$ coupled to the further current flow path through at least one further transistor $M_3$ in the second gain stage A2, the current mirror circuitry comprising a current mirror flow line $I_{BR}$, $M_{3R}$ between a supply line $V_{CC}$ and ground GND with a sensing node E in the current mirror flow line $I_{BR}$, $M_{3R}$ configured to produce a sensing signal which is indicative of the current supplied to the load $C_L$ at the output node $V_{OUT}$; and a coupling line 100 coupling the sensing node E in the current mirror flow line to the control node of the first transistor $M_{1A}$ in the first gain stage A1, wherein the sensing signal at the sensing node E is fed back to the control node of the first transistor $M_{1A}$ in the first gain stage A1.

The exemplary (non-inverting) implementation of FIG. 6 may share with the exemplary (inverting) implementation of FIG. 5, other advantageous features. For instance, in both implementations of FIGS. 5 and 6, the second gain stage A2 comprises an output current flow line between the supply line $V_{CC}$ and ground GND comprising a respective bias current source $I_B$ coupled to the further current flow path through the further transistor $M_3$ with the output node $V_{OUT}$ (or C) arranged intermediate the respective bias current source $I_B$ and the further transistor $M_3$.

Also, in both implementations of FIGS. 5 and 6, the current mirror circuitry $I_{BR}$, $M_{3R}$ comprises a current mirror flow line between the supply line $V_{CC}$ and ground GND, the current mirror flow line comprising a mirror bias current source $I_{BR}$ coupled to a current mirror transistor such as $M_{3R}$ with the sensing node E arranged intermediate the mirror bias current source $I_{BR}$ and the current mirror transistor $M_{3R}$.

For instance, in both implementations of FIGS. 5 and 6, the coupling network of the second gain stage A2 to the first gain stage A1 comprises (only) a capacitor $C_C$ coupling the coupling node D in the first gain stage A1 to the output node C (or $V_{OUT}$) in the second gain stage A2.

In both implementations of FIGS. 5 and 6, the further transistor $M_3$ and the current mirror transistor $M_{3R}$ may be biased in weak inversion.

For instance, in both implementations of FIGS. 5 and 6, the respective bias current source $I_B$ and mirror bias current source $I_{BR}$ may be configured to provide currents proportional to absolute temperature (PTAT).

The previous discussion, referred to a class-A two-stage amplifier, can be extended to class-AB two-stage amplifier as illustrated in FIG. 7 (inverting configuration) and FIG. 8 (non-inverting configuration).

As well known to those of skill in the art, Class-AB amplifier operation involves a combination of Class A operation (for small power outputs) and class B operation (for larger current outputs), usually achieved by pre-biasing two transistors in the amplifier output stage.

Resorting to Class-AB amplifier architecture within the context discussed herein essentially involves: devising (in a manner known per se) a different topology of the coupling network between the two stages A1, A2; and including the sensing node E in a current mirror flow line configured to produce a sensing signal which is indicative of the current supplied to the load $C_L$ at the output node $V_{OUT}$ of the class-AB amplifier, so that the sensing signal at the sensing node can be fed back to the first gain stage A1 to produce a pole-zero doublet as already discussed in the foregoing in connection with the implementations of FIGS. 5 and 6.

A class-AB amplifier as illustrated by way of example in FIG. 7 and FIG. 8 again comprises a first differential stage A1 with a tail bias current generator 21B coupled to ground GND and sinking current at a point B from the parallel connection of a first current flow line and a second current flow line between the node B and a supply voltage $V_{CC}$.

The first current flow line includes the cascaded current flow paths (source-drain, in the exemplary case of MOSFET transistors considered herein) through a first pair of transistors, namely a transistor $M_{1A}$ and a (diode connected) transistor $M_{2A}$.

The second current flow line includes the cascaded current flow paths (source-drain, in the exemplary case of MOSFET transistors considered herein) through a second pair of transistors, namely a transistor $M_{1B}$ and a transistor $M_{2B}$.

A differential input voltage is applied (possibly with the intervention of the resistor $R_1$) across the control terminals (gates, in the exemplary case of MOSFET transistors considered herein) of the transistor $M_{1A}$ (which is arranged between the transistor $M_{2A}$ and the node B) and of the transistor $M_{1B}$ (which is arranged between the transistor $M_{2B}$ and the node B).

Despite the possible different relative arrangement with respect to the bias source 21B, in FIGS. 7 and 8 designations corresponding to those of FIGS. 5 and 6 have been retained for the transistors $M_{1A}$ and $M_{1B}$ which receive at their control terminals (gates, in the exemplary case of MOSFET transistors considered herein) the differential input signals.

Likewise, in FIGS. 7 and 8 designations corresponding to those of FIGS. 5 and 6 have been retained for the transistors $M_{2A}$ and $M_{2B}$ that have their control terminals (gates, in the exemplary case of MOSFET transistors considered herein) mutually coupled.

Moving from left to right in the circuit diagrams of FIGS. 7 and 8, the class-AB amplifier circuit illustrated in FIGS. 7 and 8, comprises a pair of current flow lines between the supply line $V_{CC}$ and ground GND.

Of these pair of current flow lines: a first one comprises a bias current generator $I_B$ which is coupled to the supply line $V_{CC}$ and injects current at a node $D_1$ into the cascaded current flow paths (source-drain, in the exemplary case of MOSFET transistors considered herein) through a pair of diode-connected transistors $M_6$ and $M_4$, with the transistor $M_6$ intermediate the current generator and the transistor $M_4$; and a second one comprises a bias current generator $I_B$ which is coupled to ground GND and sinks current at a node $D_2$ from the cascaded current flow paths (source-drain, in the exemplary case of MOSFET transistors considered herein) through a pair of diode-connected transistors $M_7$ and $M_5$, with the transistor $M_7$ intermediate the current generator and the transistor $M_5$.

Again, moving from left to right in the circuit diagrams of FIGS. 7 and 8, in the class-AB amplifier circuit illustrated in FIGS. 7 and 8, a further current flow line is provided between the supply line $V_{CC}$ and ground GND comprising: a bias current generator $I_B$ acting intermediate the supply line $V_{CC}$ and the (coupling) node D (also referred to as node $C_2$ in the following) between the transistors $M_{1B}$ and $M_{2B}$ in the first stage A1; the flow path (source-drain, in the exemplary case of a MOSFET transistor) from the node $C_2$ to a node $C_1$ through a transistor $M_5$ having its control terminal (gate, in the exemplary case of a MOSFET transistor) coupled to the control terminal (gate, in the exemplary case of a MOSFET transistor) of the transistor $M_6$; a further bias current generator $I_B$ acting intermediate the transistor $M_5$ (node $C_1$) and ground GND, so that the transistor $M_5$ is arranged intermediate the nodes $C_1$ and $C_2$ (that is intermediate the two bias current generators $I_B$, coupled to the nodes $C_1$ and $C_2$); and a transistor $M_9$ arranged with the flow path (source-drain, in the exemplary case of a MOSFET transistor) therethrough coupled to the nodes $C_1$ and $C_2$ in parallel to the flow path though the transistor $M_8$ and its control terminal (gate, in the exemplary case of a MOSFET transistor) coupled to the control terminal (gate, in the exemplary case of a MOSFET transistor) of the diode-connected transistor $M_7$.

In a class-AB amplifier as illustrated in FIGS. 7 and 8 the second stage A2 comprises a pair of output transistors $M_2$ and $M_3$ arranged with: the current paths therethrough (source-drain, in the exemplary case of MOSFET transistors) cascaded in a current flow line from the supply line at a voltage $V_{CC}$ and ground GND (with the transistor $M_3$ coupled to the supply line at a voltage $V_{CC}$ and the transistor $M_2$ coupled to ground GND); and their control terminals (gates, in the exemplary case of MOSFET transistors) coupled to the nodes $C_1$ and $C_2$ opposed ends of the parallel connection of the transistors $M_5$ and $M_9$, with the gate of the transistor $M_3$ thus coupled via the node $C_2$ to the coupling node D in the first stage A1.

In a class-AB amplifier as illustrated in FIGS. 7 and 8 the node C in the second stage A2 which provides the output voltage $V_{OUT}$ to the capacitive load $C_L$ is arranged intermediate the cascaded current flow paths through the transistors $M_2$ and $M_3$ and is coupled via capacitors having capacitance values $C_C/2$ to the nodes $C_1$, $C_2$, namely to the control terminals (gates, in the exemplary case of MOSFET transistors) of the transistors $M_2$ and $M_3$.

The following relationships will be assumed to apply to the class-AB amplifier illustrated in FIGS. 7 and 8:

$M_8 = M_6/2$ $M_9 = M_7/2$ $M_2 = k \cdot M_4$ $M_3 = k \cdot M_5$.

The meaning of these relationships (essentially the ratio of the active areas of the transistors involved) is conventional in the art.

Also, in the case of a class-AB amplifier as illustrated in FIGS. 7 and 8, the underlying concept of the embodiments involves creating a zero in the transfer function for Gloop aiming at tracking with high accuracy the output pole, independently of the process, temperature, and supply voltage.

Here again this approach can be implemented by sensing ("reading") the capacitive output current in $C_L$ and feeding it back to a node in the control loop for Gloop to create a zero that depends on the load capacitance $C_L$.

A possible implementation illustrated in FIGS. 7 and 8 comprises two transistors (such as MOSFETs) Max and $M_{3R}$ configured to read the current in $C_L$ and feed a corresponding sensing signal at a node here again designated E back to the common node of the feedback network between $R_1$ and $R_2$, that is, the virtual ground node X.

As illustrated in FIGS. 7 and 8 the transistors Max and $M_{3R}$ are arranged with: the current paths therethrough (source-drain, in the exemplary case of MOSFET transistors) cascaded in a current flow line from the supply line at a voltage $V_{CC}$ and ground GND, and the signal sent back to the common node E of the feedback network between $R_1$ and $R_2$ tapped intermediate the cascaded current flow paths through the transistors Max and $M_{3R}$, and their control terminals (gates, in the exemplary case of MOSFET transistors) coupled to the control terminals (here, gates) of the transistor $M_3$ (for the transistor $M_{3R}$) and of the transistor $M_2$ (for the transistor Max).

In addition to basic features shared also with the implementations of FIGS. 5 and 6, the implementations of FIGS. 7 and 8 thus share between them features such as: current mirror circuitry Max, $M_{3R}$ coupled to the current flow path through the further transistors $M_2$, $M_3$ in the second gain stage A2, the current mirror circuitry Max, $M_{3R}$ comprising a current mirror flow line $M_{2R}$, $M_{3R}$ between the supply line $V_{CC}$ and ground GND with the sensing node E in the current mirror flow line $M_{2R}$, $M_{3R}$ configured to produce a sensing signal which is indicative of the current supplied to the load $C_L$ at the output node $V_{OUT}$; and the coupling line 100 coupling the sensing node E in the current mirror flow line to the control node of the first transistor $M_{1A}$ in the first gain stage A1.

As in the case of the implementations of FIGS. 5 and 6, in the implementations of FIGS. 7 and 8 the sensing signal at the sensing node E is fed back to the control node of the first transistor $M_{1A}$ in the first gain stage A1.

It can be shown that the poles $p_d$, $p_1$, and the zero $z_1$ for the transfer function for Gloop are given by the following formulae:

$$p_d = -\frac{1}{r_{o1}(1 + g_{m3}r_{out})C_C}$$

$$p_1 = -\frac{(g_{m3} + g_{m2})(R_1 + R_2) + (g_{m3R} + g_{m2R})R_1}{C_L(R_1 + R_2)} \cong -\frac{g_{m3} + g_{m2}}{C_L}$$

$$z_1 = -\frac{(g_{m3} + g_{m3R} + g_{m2} + g_{m2R})/g_{m3R} + g_{m2R}}{R_2 C_L + C_C(R_2 - 1/(g_{m3R} + g_{m2R}))}$$

where $g_{m2}$ and $g_{m3}$ are transconductances the transistors $M_2$ and $M_3$.

Here again, the approximation $g_{m3R} \ll g_{m3}$ can be held to apply in so far as the output stage $M_2$, $M_3$ is biased at a (much) higher current than the associated current mirror stage $M_{2R}$, $M_{3R}$.

Advantageously, sizing $M_{3R}$ and $I_{BR}$ in such a way that $g_{m3R}R_2=1$ results in the following relationships:

$$p_1 \cong -\frac{g_{m3} + g_{m2}}{C_L}$$

$$z_1 = -\frac{g_{m3} + g_{m2} + g_{m3R} + g_{m2R}}{(g_{m3R} + g_{m2R})R_2 C_L} = -\frac{g_{m3} + g_{m2} + g_{m3R} + g_{m2R}}{C_L} \cong -\frac{g_{m3} + g_{m2}}{C_L}$$

This again represents a nearly perfect cancellation between the output pole and the zero.

Here again, a pole-zero cancellation as desired is facilitated with the condition $(g_{m3R}*g_{m2R})R_2=1$ (always) valid irrespective of process, voltage, and temperature (PVT) conditions.

This result can be achieved by designing (in a manner known per se) the transistors $M_3$, $M_2$, $M_{3R}$, and Max in weak inversion (gate-to-source voltage below the threshold voltage), and choosing biasing currents $I_B$ of the PTAT (Proportional To Absolute Temperature) type that depend inversely on a resistor $R_{bias}=\alpha R_2$ of the same type of $R_2$, as reported in the cases of FIGS. 5 and 6.

Advantageously, in both implementations of FIGS. 7 and 8, the second gain stage A2 comprises an output current flow line between the supply line $V_{CC}$ and ground GND with such an output current flow line comprising the cascaded current flow paths through a first further transistor $M_2$ and a second further transistor $M_3$ with the output node C (or $V_{OUT}$) arranged at the output current flow line intermediate the first further transistor $M_2$ and the second further transistor $M_3$.

In both implementations of FIGS. 7 and 8, a current mirror circuitry is provided which comprises a current mirror flow line between the supply line $V_{CC}$ and ground GND. As illustrated, such a current mirror flow line comprises the cascaded current flow paths through a first current mirror transistor Max and a second current mirror transistor $M_{3R}$ with the sensing node E arranged at such current mirror flow line intermediate the first current mirror transistor Max and the second current mirror transistor $M_{3R}$.

In the implementations illustrated in FIGS. 7 and 8, class-AB operation is facilitated by a coupling network of the second gain stage A2 to the first gain stage A1 which comprises a pair of capacitors $C_C/2$ coupling the output node C (or $V_{OUT}$) in the second gain stage A2 to a first node $C_1$ and a second node $C_2$ located at opposed ends of the parallel connection of the current flow paths (source-drain, in the exemplary case of MOSFETs considered herein) through a first coupling transistor $M_5$ and a second coupling transistor $M_9$.

In the implementations illustrated in FIGS. 7 and 8, the parallel connection of the current flow paths through the first coupling transistor $M_5$ and the second coupling transistor $M_9$ is interposed between a pair of bias current generators in a current flow line between the supply line $V_{CC}$ and ground GND.

In such a current flow line, the first further transistor $M_2$ and the second further transistor $M_3$ in the output current flow line in the second gain stage A2 have control nodes coupled to the node $C_1$ and the node $C_2$, respectively.

Also, the node $C_2$ is coupled to the coupling node D in the first gain stage A1 and the first coupling transistor $M_5$ has a control node (gate, in the exemplary case of a MOSFET as considered herein) coupled to a first drive node (that is, the node designated $D_1$) in a first drive current line, namely $I_B$, $M_4$, $M_6$, between the supply line $V_{CC}$ and ground GND.

Such a first drive current line comprises the cascaded arrangement of a first drive current bias generator $I_B$ and a (first) series connection of diode junctions (as provided, for instance by the diode-connected transistors $M_4$, $M_6$), the drive current bias generator $I_B$ being arranged between the supply line $V_{CC}$ and the first drive node $D_1$.

As illustrated in FIGS. 7 and 8, the second coupling transistor $M_9$ has a control node (gate, in the exemplary case of a MOSFET as considered herein) coupled to a second drive node (that, is the node $D_2$) in a second drive current line between the supply line $V_{CC}$ and ground GND.

As illustrated in FIGS. 7 and 8, such a second drive current line comprises the cascaded arrangement of a (second) series connection of diode junctions (as provided by the diode-connected transistors $M_5$, $M_7$) and a second drive current bias generator $I_B$, with such the drive current bias generator arranged between ground GND and the second drive node $D_2$.

Thanks to the pole-zero doublet discussed previously, a class-AB amplifier circuit as exemplified in FIGS. 7 and 8 was found exhibit—in terms of stability—a behavior thoroughly similar to the behavior of a single-pole OTA, with the capability of being intrinsically stable irrespective of the value of the capacitive load $C_L$ and even in the presence of a (very) small compensation capacitor $C_C$ (3 pF, for instance).

This may apply, for instance, for closed-loop gains ranging from 0 dB to 20 dB, with $C_L$ varied from 0.1 pF to 10 nF with $C_C$=3 pF. In all cases considered, the phase margin was found to be always higher than 60 degrees, showing fully adequate stability.

Regarding the closed-loop behavior, since the zero is introduced on the feedback path (and not in the forward path), the closed loop bandwidth is equal to the lower one between the original Unity-Gain Bandwidth (UGB) for Gloop and the zero frequency $z_1$, whereas the in-band gain Gain can be expressed as:

$$\text{Gain} = -\frac{R_2}{R_1\left(1 + \frac{g_{m3R} + g_{m2R}}{g_{m3} + g_{m2}}\right)} \cong -\frac{R_2}{R_1}$$

in the case of the inverting configuration of FIG. 7 or as:

$$\text{Gain} = 1 + \frac{R_2}{R_1\left(1 + \frac{g_{m3R} + g_{m2R}}{g_{m3} + g_{m2}}\right)} \cong 1 + \frac{R_2}{R_1}$$

in the case of the non-inverting configuration of FIG. 8.

Fully adequate performance was experimented with input and output voltages with a 100 kHz, 10 kHz, 1 kHz and a 100 Hz sine wave input, for $C_L$ equal to 10 pF, 100 pF, 1 nF, and 10 nF respectively, for 0 dB and 20 dB gain and $C_C$=3 pF.

Just like the implementations of FIGS. 5 and 6, the implementations of FIGS. 7 and 8 may facilitate designing the circuit 10 by: designing the first gain stage A1, the second gain stage A2 with the coupling network of the second gain stage A2 to the first second gain stage A1, and the feedback line $R_1$, $R_2$ coupling the output node C in the second gain stage A2 to the control node of the first transistor $M_{1A}$ in the first gain stage A1, to obtain a loop transfer function Gloop having (at least) one output pole, namely $p_1$; and designing the current mirror circuitry (that is: $I_{BR}$, $M_{3R}$ in the implementations of FIGS. 5 and 6 and Max, $M_{3R}$ in the implementations of FIGS. 7 and 8) with the coupling line 100 to obtain a loop transfer function Gloop having an output zero $z_1$ which cancels out the output pole $p_1$ as a result of the sensing signal at the sensing node E being fed back to the control node (e.g., gate) of the first transistor $M_{1A}$ in the first gain stage A1.

In all the implementations of FIGS. 5, 6, 7 and 8 a feedback line is provided comprising a first resistor (namely $R_2$) coupling the output node C (or $V_{OUT}$) in the second gain stage A2 and the control node (gate, in the exemplary case of a MOSFET as considered herein) of the first transistor $M_{1A}$ in the first gain stage A1.

The feedback line also comprises a second resistor (namely $R_1$) which is coupled to the control node of the first transistor $M_{1A}$ in the first gain stage (A1), with the second resistor $R_1$ configured to apply to the control node of the first transistor $M_{1A}$: in the case of the "inverting" configurations of FIGS. 5 and 7, an input signal $V_{IN}$ with the control node (e.g., gate) of the second transistor $M_{1B}$ having applied thereto a reference signal $V_{CM}$; or in the case of the "non-inverting" configurations of FIGS. 6 and 8, a reference signal $V_{CM}$ with the control node of the second transistor $M_{1B}$ having applied thereto an input signal $V_{IN}$.

A circuit as discussed herein lends itself to being included in a device comprising a capacitive load $C_L$ coupled to the output node C (or $V_{OUT}$) in the second gain stage A2.

A device including electrostatic and/or piezo-electric actuators, e.g., with an associated capacitive value from few pF to tens of nF, may be exemplary of such a device.

Without prejudice to the underlying principles, the details and embodiments may vary, even significantly, with respect to what has been described by way of example only without departing from the extent of protection.

The claims are an integral part of the technical teaching on the embodiments as provided herein.

The extent of protection is determined by the annexed claims.

The invention claimed is:

1. A circuit, comprising:
a first gain stage having a differential input transistor pair comprising a first transistor with a control node and a current flow path and a second transistor with a control node and a current flow path, and having a bias current source coupled to the current flow path of the first transistor and the current flow path of the second transistor, wherein the control node of the first transistor and the control node of the second transistor are configured to have an input signal applied therebetween, and wherein the second transistor is located between the bias current source and a coupling node in the current flow path through the second transistor;
a second gain stage having an output node configured to be coupled to a load and to apply thereto an output voltage which is a function of the input signal applied between the control nodes of the first transistor and the second transistor, wherein the second gain stage comprises a further current flow path through at least one further transistor;
a coupling network configured to couple the coupling node in the first gain stage to the output node in the second gain stage;
a feedback line coupling the output node in the second gain stage to the control node of the first transistor in the first gain stage;
current mirror circuitry coupled to said further current flow path through the at least one further transistor in the second gain stage, the current mirror circuitry comprising a current mirror flow line between a supply line and ground with a sensing node in the current mirror flow line configured to produce a sensing signal which is indicative of the current supplied to the load at the output node; and
a coupling line directly connecting the sensing signal produced at the sensing node in the current mirror flow line in the second gain stage in feed back to the control node of the first transistor in the first gain stage.

2. The circuit of claim 1,
wherein the second gain stage comprises an output current flow line between the supply line and ground, the output current flow line comprising a respective bias current source coupled to said further current flow path through the at least one further transistor with the output node arranged intermediate the respective bias current source and the at least one further transistor; and
wherein the current mirror circuitry comprises a current mirror flow line between the supply line and ground, the current mirror flow line comprising a mirror bias current source coupled to a current mirror transistor with the sensing node intermediate the mirror bias current source and the current mirror transistor.

3. The circuit of claim 2, wherein the coupling network comprises a capacitor coupling the coupling node in the first gain stage to the output node in the second gain stage.

4. The circuit of claim 2, wherein said further transistor and said current mirror transistor are biased in weak inversion.

5. The circuit of claim 2, wherein said respective bias current source and said mirror bias current source are configured to provide currents proportional to absolute temperature (PTAT).

6. The circuit of claim 2,
wherein said feedback line comprises a feedback resistor coupling the output node in the second gain stage to the control node of the first transistor in the first gain stage; and
wherein said respective bias current source and said mirror bias current source are configured to provide currents inversely proportional to the resistance of said feedback resistor.

7. A system, comprising:
a circuit of claim 1; and
a capacitive load coupled to the output node in the second gain stage of said circuit.

8. A method of designing a circuit of claim 1, comprising:
designing the first gain stage, the second gain stage, the coupling network of the second gain stage to the first second gain stage, with the feedback line coupling the output node in the second gain stage to the control node of the first transistor in the first gain stage, to obtain a loop transfer function having an output pole; and
designing said current mirror circuitry with said coupling line coupling the sensing node in the current mirror flow line in the second gain stage to the control node of the first transistor in the first gain stage to obtain a loop transfer function having an output zero cancelling out said output pole in response to the sensing signal at the sensing node being fed back to the control node of the first transistor in the first gain stage.

9. The circuit of claim 1, wherein the sensing signal is produced at a drain of the at least one further transistor in the second gain stage, and wherein the sensing signal is directly applied to the to the control node of the first transistor in the first gain stage.

10. A circuit, comprising:
a first gain stage having a differential input transistor pair comprising a first transistor with a control node and a current flow path and a second transistor with a control node and a current flow path, and having a bias current source coupled to the current flow path of the first transistor and the current flow path of the second transistor, wherein the control node of the first transistor and the control node of the second transistor are configured to have an input signal applied therebetween, and wherein the second transistor is located between the bias current source and a coupling node in the current flow path through the second transistor;
a second gain stage having an output node configured to be coupled to a load and to apply thereto an output voltage which is a function of the input signal applied between the control nodes of the first transistor and the second transistor, wherein the second gain stage comprises a further current flow path through at least one further transistor;
a coupling network configured to couple the coupling node in the first gain stage to the output node in the second gain stage;
a feedback line coupling the output node in the second gain stage to the control node of the first transistor in the first gain stage;
current mirror circuitry coupled to said further current flow path through the at least one further transistor in the second gain stage, the current mirror circuitry comprising a current mirror flow line between a supply line and ground with a sensing node in the current mirror flow line configured to produce a sensing signal which is indicative of the current supplied to the load at the output node; and
a coupling line directly connecting the sensing signal produced at the sensing node in the current mirror flow line in the second gain stage in feed back to the control node of the first transistor in the first gain stage;
wherein said at least one further transistor comprises a first further transistor and a second further transistor;
wherein the second gain stage comprises an output current flow line between the supply line and ground, the output current flow line comprising cascaded current flow paths through said first further transistor and said second further transistor with the output node arranged at the output current flow line intermediate the first further transistor and the second further transistor; and
wherein the current mirror circuitry comprises a current mirror flow line between the supply line and ground, the current mirror flow line comprising the cascaded current flow paths through a first current mirror transistor and a second current mirror transistor with the sensing node arranged at the current mirror flow line intermediate the first current mirror transistor and the second current mirror transistor.

11. The circuit of claim 10, wherein the coupling network comprises a pair of capacitors coupling the output node in the second gain stage to a first node and a second node at opposed ends of the parallel connection of the current flow paths through a first coupling transistor and a second coupling transistor, said parallel connection of the current flow paths through a first coupling transistor and a second coupling transistor being interposed between a pair of bias current generators in a current flow line between the supply line and ground.

12. The circuit of claim 11,
wherein the first further transistor and the second further transistor in the output current flow line in the second gain stage have control nodes coupled to said first node and said second node, respectively;
wherein said second node is coupled to the coupling node in the first gain stage;
wherein the first coupling transistor has a control node coupled to a first drive node in a first drive current line between the supply line and ground, the first drive current line comprising the cascaded arrangement of a first drive current bias generator and a first series connection of diode junctions, the drive current bias generator arranged between the supply line and the first drive node; and
wherein the second coupling transistor has a control node coupled to a second drive node in a second drive current line between the supply line and ground, the second drive current line comprising the cascaded arrangement of a second series connection of diode junctions and a second drive current bias generator, the drive current bias generator arranged between ground and the second drive node.

13. The circuit of claim 12, wherein said bias current generators are configured to provide currents proportional to absolute temperature (PTAT).

14. The circuit of claim 12,
wherein said feedback line comprises a feedback resistor coupling the output node in the second gain stage to the control node of the first transistor in the first gain stage; and
wherein said bias current generators are configured to provide currents inversely proportional to the resistance of said feedback resistor.

15. The circuit of claim 10, wherein said first further transistor, said second further transistor, said first current mirror transistor and said second current mirror transistor are biased in weak inversion.

16. A circuit, comprising:
a first gain stage having a differential input transistor pair comprising a first transistor with a control node and a current flow path and a second transistor with a control node and a current flow path, and having a bias current source coupled to the current flow path of the first transistor and the current flow path of the second transistor, wherein the control node of the first transistor and the control node of the second transistor are configured to have an input signal applied therebetween, and wherein the second transistor is located between the bias current source and a coupling node in the current flow path through the second transistor;
a second gain stage having an output node configured to be coupled to a load and to apply thereto an output voltage which is a function of the input signal applied between the control nodes of the first transistor and the second transistor, wherein the second gain stage comprises a further current flow path through at least one further transistor;
a coupling network configured to couple the coupling node in the first gain stage to the output node in the second gain stage;
a feedback line coupling the output node in the second gain stage to the control node of the first transistor in the first gain stage;

current mirror circuitry coupled to said further current flow path through the at least one further transistor in the second gain stage, the current mirror circuitry comprising a current mirror flow line between a supply line and ground with a sensing node in the current mirror flow line configured to produce a sensing signal which is indicative of the current supplied to the load at the output node; and a coupling line directly connecting the sensing signal produced at the sensing node in the current mirror flow line in the second gain stage in feed back to the control node of the first transistor in the first gain stage;

wherein the feedback line comprises:
a first resistor coupling the output node in the second gain stage and the control node of the first transistor in the first gain stage; and
a second resistor coupled to the control node of the first transistor in the first gain stage, wherein the second resistor configured to apply to the control node of the first transistor one of:
an input signal with the control node of the second transistor having applied thereto a reference signal; or
a reference signal with the control node of the second transistor having applied thereto an input signal.

17. A circuit, comprising:
a differential input stage including a pair of input transistors having control terminals configured to receive a first signal and a second signal, wherein a first input transistor of said pair of input transistors generates a difference signal;

an output stage including an output transistor having a control terminal configured to receive the difference signal and a drain terminal that generates an output signal;

a resistive feedback circuit coupled between the drain terminal of the output transistor and the control terminal of a second input transistor of said pair of input transistors;

a sense transistor connected to said output transistor in a current mirror circuit, said sense transistor having a control terminal configured to receive the difference signal and a drain terminal that generates a sensing signal indicative of current delivered by the output signal; and a feedback path configured to apply the sensing signal directly to said second input transistor of said pair of input transistors.

18. The circuit of claim 17, further comprising a Miller compensation capacitor coupled between the drain terminal and control terminal of the output transistor.

19. The circuit of claim 17, wherein said sense transistor and said output transistor are biased in weak inversion.

20. A circuit, comprising:
a differential input stage including a pair of input transistors having control terminals configured to receive a first signal and a second signal, wherein a first input transistor of said pair of input transistors generates a difference signal;

an output stage including an output transistor having a control terminal configured to receive the difference signal and a drain terminal that generates an output signal;

a resistive feedback circuit coupled between the drain terminal of the output transistor and the control terminal of a second input transistor of said pair of input transistors;

a sense transistor connected to said output transistor in a current mirror circuit, said sense transistor having a control terminal configured to receive the difference signal and a drain terminal that generates a sensing signal indicative of current delivered by the output signal;

a feedback path configured to apply the sensing signal to said second input transistor of said pair of input transistors; and an output current source coupled to the output transistor and a mirror current source coupled to the sense transistor, wherein currents supplied by said output current source and said mirror current source are proportional to absolute temperature (PTAT) currents.

* * * * *